(12) United States Patent
Miyaba

(10) Patent No.: US 6,813,130 B2
(45) Date of Patent: Nov. 2, 2004

(54) SEMICONDUCTOR INTEGRATED CIRCUIT DEVICE INCLUDING PROTECTION CIRCUIT FOR PREVENTING CIRCUIT BREAKDOWN BY STATIC ELECTRICITY

(75) Inventor: Takeshi Miyaba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 181 days.

(21) Appl. No.: 10/162,610

(22) Filed: Jun. 6, 2002

(65) Prior Publication Data
US 2003/0202309 A1 Oct. 30, 2003

(30) Foreign Application Priority Data
Apr. 26, 2002 (JP) ........................................ 2002-126554

(51) Int. Cl.$^7$ .................................................. H02H 3/00
(52) U.S. Cl. ........................................ 361/104; 361/111
(58) Field of Search .............................. 361/54, 56, 78, 361/91.1, 103, 104, 105, 106, 111

(56) References Cited

U.S. PATENT DOCUMENTS

| | | | | |
|---|---|---|---|---|
| 5,596,466 A | * | 1/1997 | Ochi | 361/18 |
| 5,991,135 A | * | 11/1999 | Saleh | 361/56 |
| 6,002,568 A | * | 12/1999 | Ker et al. | 361/111 |
| 6,075,686 A | * | 6/2000 | Ker | 361/56 |
| 6,411,485 B1 | * | 6/2002 | Chen et al. | 361/111 |
| 6,459,555 B1 | * | 10/2002 | Welbers et al. | 361/91.1 |

FOREIGN PATENT DOCUMENTS

| | | |
|---|---|---|
| JP | 3123984 | 1/2001 |
| JP | 2001-244338 | 9/2001 |
| KR | 2000-0012114 | 2/2000 |
| KR | 2001-0030493 | 4/2001 |
| KR | 3275893 | 4/2002 |

* cited by examiner

Primary Examiner—Jonathan Salata
(74) Attorney, Agent, or Firm—Oblon, Spivak, McClelland, Maier & Neustadt, P.C

(57) ABSTRACT

A first power wire supplies a power potential to a circuit having a first function. A first ground wire supplies a ground potential to the circuit having the first function. A first protection circuit is connected between the first power wire and first ground wire, and protects the circuit having the first function. A second power wire supplies a power potential to a circuit having a second function. A second ground wire supplies a ground potential to the circuit having the second function. A second protection circuit is connected between the second power wire and the second ground wire, and protects the circuit having the second function. The element is disposed in at least one of intervals between the first power wire and the second power wire and between the first ground wire and the second ground wire, and brings one of the intervals into a disconnected state.

28 Claims, 2 Drawing Sheets

SEMICONDUCTOR INTEGRATED CIRCUIT DEVICE INCLUDING PROTECTION CIRCUIT FOR PREVENTING CIRCUIT BREAKDOWN BY STATIC ELECTRICITY

CROSS-REFERENCE TO RELATED APPLICATIONS

This application is based upon and claims the benefit of priority from the prior Japanese Patent Application No. 2002-126554, filed Apr. 26, 2002, the entire contents of which are incorporated herein by reference.

BACKGROUND OF THE INVENTION

1. Field of the Invention

The present invention relates to a semiconductor integrated circuit device including a protection circuit which prevents circuit breakdown by static electricity, a mounted substrate device on which the semiconductor integrated circuit device is mounted, and a method of removing power lines of a circuit group which are formed in the semiconductor integrated circuit device and which have different functions, particularly to a protection circuit included in the semiconductor integrated circuit device with mixed digital and analog circuits.

2. Description of the Related Art

A protection circuit (constituted of a protection diode, protection transistor, and the like) for protecting a circuit from electrostatic breakdown has previously been built into a large scale integrated circuit (hereinafter referred to as an LSI) which has a MOS transistor circuit. The protection circuit is constituted, for example, of a protection transistor, protection diode, and the like.

The protection circuit discharges static electricity so that the static electricity does not reach the MOS transistor circuit inside the LSI, and protects the MOS transistor circuit, when an electrostatic discharge (hereinafter referred to as an ESD) is generated in a signal input/output terminal of the LSI from a human body or various types of devices in handling the LSI before actually being mounted on a circuit substrate and used.

In recent years, there has been a tendency to mount a large number of circuits having other functions in one chip and to raise an integration degree of a system LSI. For example, there has been a tendency toward a further increasing demand for an LSI mixed/loaded with the digital and analog circuits such as an RF module integrated with an analog circuit and base band LSI in a portable apparatus.

When the analog and digital circuits are mounted in this mixed manner, interference between the analog and digital circuits has to be avoided. For example, when the digital circuit operates, noise is generated from power and ground lines, which effects the analog circuit.

However, when the influences of the noises are excessively worried about, if a power wire of a digital circuit part is not placed through an analog circuit part, due to concerns about noise, a current path for removing an ESD surge cannot be secured.

As described above, there is a problem that the power wire connected to a protection element of the conventional mixed LIS mixed/loaded with the digital and analog circuits is a factor which hinders accurate circuit operation of the analog circuit part. This is because the power noise resulting from a digital circuit operation and generated in the power wire inhibits signal propagation of the analog circuit part.

For example, suppose that an analog exclusive-use LSI and digital/analog mixed/loaded LSI are mounted on the circuit substrate. The analog exclusive-use LSI outputs an analog signal (gain signal having a certain voltage). The digital/analog mixed/loaded LSI includes an analog/digital (A/D) converter and digital signal processor (DSP). The A/D converter receives the analog signal, converts the analog signal to a digital signal, and transmits the digital signal to the DSP.

It is now assumed that the analog signal outputted from the analog exclusive-use LSI is received by the digital/analog mixed/loaded LSI, noise is then generated from the digital circuit by the DSP, and this noise turns into a power supply for the analog exclusive-use LSI. It is assumed that the digital and analog circuits are both driven by a power voltage of 1.5 V. It is assumed that a wobble width of the analog signal received by the A/D converter included in the digital/analog mixed/loaded LSI is 1.5 V, and a bit of the A/D converter for sensing the voltage is divided and used in ten bits, that is, 1024 ways. In this case, a change of about 1.46 mV in the analog signal is sampled as a digital signal. Therefore, when the power supply of the analog exclusive-use LSI only fluctuates by several percent due to the operation of the digital circuit, an erratic a operation occurs in the digital/analog mixed/loaded LSI. That is, the digital/analog mixed/loaded LSI receives the analog signal including the power noise of the LSI from the analog exclusive-use LSI, and the analog signal is calculated by the DSP. This causes a problem that the wrong data may be transferred to another circuit or chip.

Moreover, the ESD protection element of the LSI is urgently required in the step of sealing a silicon chip in a package, and packing, conveying or otherwise handling the LSI, and the step of mounting the LSI on the circuit substrate in a manufacturing process of the LSI. After the LSI is actually mounted on the circuit substrate and connected to the wiring of the circuit substrate, the capacitance of the whole circuit substrate increases, and the chance of the signal input/output terminal of the LSI being exposed. Therefore, the necessity of protection is reduced, and the ESD protection element is deleted with few problems.

BRIEF SUMMARY OF THE INVENTION

The present invention is generally directed to the area of electro-static protection of electronic devices. According to one aspect of the present invention, there is provided a semiconductor integrated circuit device that includes plural power wires and plural ground wires and is capable of performing plural functions. Such a circuit device may include a first power wire which supplies a power potential to a circuit having a first function; a first ground wire which supplies a ground potential to the circuit having the first function; a first protection circuit which is connected between the first power wire and the first ground wire, and protects the circuit having the first function; a second power wire which supplies a power potential to a circuit having a second function; a second ground wire which supplies a ground potential to the circuit having the second function; a second protection circuit which is connected between the second power wire and the second ground wire, and protects the circuit having the second function. The circuit device further includes an element which is disposed in at least one of plural intervals between the first power wire and the second power wire and between the first ground wire and the second ground wire, and brings one of the plural intervals into a disconnected state.

Moreover, according to another aspect of the present invention, there is provided a mounted substrate device including a semiconductor integrated circuit device as described above, wherein the element is a fuse element, and a circuit substrate on which the semiconductor integrated circuit device is mounted. The circuit substrate has a plurality of wire patterns connected to the first power wire, second power wire, first ground wire, and second ground wire.

Furthermore, according to another aspect of the present invention, there is provided a wire disconnecting method of a mounted substrate device. The method includes forming a semiconductor integrated circuit device as described above, wherein the element is a fuse element; mounting the semiconductor integrated circuit device on a circuit substrate; supplying a voltage to the fuse element in the semiconductor integrated circuit device; and disconnecting the fuse element. A fuse element brings one of the intervals into either one state of a connected state and a disconnected state.

DETAILED DESCRIPTION OF THE INVENTION

Figure 1A:
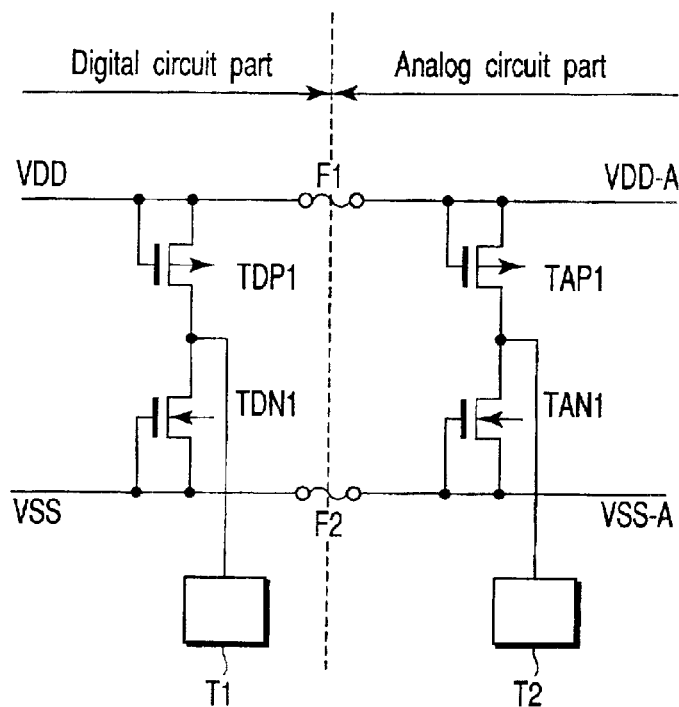
FIGS. 1A and 1B are circuit diagrams showing constitutions of an ESD protection circuit inside a semiconductor integrated circuit device according to a first embodiment of the present invention.

Embodiments of the present invention will be described hereinafter with reference to the drawings. In the description, common parts are denoted with common reference numerals throughout the drawings. First Embodiment First, a semiconductor integrated circuit device according to a first embodiment of the present invention will be described.

Figure 1B:
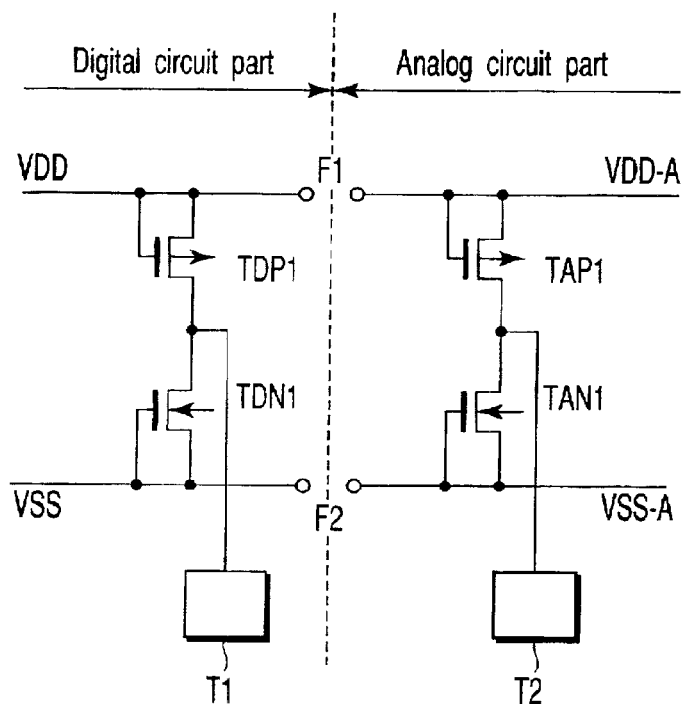

FIGS. 1A, 1B are circuit diagrams showing a constitution of an ESD protection circuit inside the semiconductor integrated circuit device of the first embodiment. FIG. 1A shows a state in which a fuse element described later is not disconnected, and FIG. 1B shows a state in which the fuse element is disconnected.

As shown in FIG. 1A, digital and analog circuit parts are mounted on the semiconductor integrated circuit device in a mixed manner. The digital and analog circuit parts are constituted of circuits having predetermined functions, respectively. A signal input/output terminal T1 is connected to an ESD protection element disposed in the digital circuit part in the integrated circuit. Moreover, a signal input/output terminal T2 is connected to the ESD protection element disposed in the analog circuit part in the integrated circuit.

A first fuse element F1 is connected between a power wire (power supply line) VDD of the digital circuit part and a power wire (power supply line) VDD-A of the analog circuit part. Furthermore, a second fuse element F2 is connected between a ground wire (reference supply line) Vss of the digital circuit part and a ground wire (reference supply line) Vss-A of the analog circuit part.

Moreover, a p channel MOS transistor TDP1 and n channel MOS transistor TDN1 constituting the ESD protection element are connected between the power wire VDD and ground wire Vss of the digital circuit part. A p channel MOS transistor TAP1 and n channel MOS transistor TAN1 constituting the ESD protection element are connected between the power wire VDD-A and ground wire Vss-A of the analog circuit part. A gate, source, and substrate region of the MOS transistor TDN1 are connected to the ground wire Vss. The drain of the MOS transistor TDN1 is connected to the drain of the MOS transistor TDP1. The gate, source, and substrate region of the MOS transistor TDP1 are connected to the power wire VDD. Moreover, the drains of the MOS transistors TDP1 and TDN1 are connected to the signal input/output terminal T1.

Furthermore, the gate, source, and substrate region of the MOS transistor TAN1 are connected to the ground wire Vss-A. The drain of the MOS transistor TAN1 is connected to the drain of the MOS transistor TAP1. The gate, source, and substrate region of the MOS transistor TAP1 are connected to the power wire VDD-A. Moreover, the drains of the MOS transistors TAP1 and TAN1 are connected to the signal input/output terminal T2.

In the protection circuit constituted in this manner, when a voltage of a forward direction is supplied to a pn junction between the substrate region and source and the drain of the MOS transistor, a current flows in the forward direction. On the other hand, when a voltage of a backward direction is supplied to the pn junction, that is, when a surge is received in a reverse bias, a breakdown occurs in the pn junction, a voltage generated by the breakdown constitutes a trigger, and a potential of a base as a substrate is slightly raised. Thereby, an interval between the source and drain of the MOS transistor is turned on as a bipolar transistor. Moreover, when a large current flows between the source and drain, a current path with a low impedance is formed. According to the above-described phenomenon, the MOS transistors TDP1, TDN1, TAP1, and TAN1 constituting the protection circuit work as a protection element.

When the semiconductor integrated circuit device having the protection circuit is manufactured as a semiconductor chip, the fuse elements F1 and F2 in the protection circuit are not disconnected. That is, the fuse elements F1 and F2 are in a non-disconnected state, before the semiconductor integrated circuit device is actually mounted on the circuit substrate.

A manufacturing process of the semiconductor integrated circuit device includes: a step of sealing a silicon chip in a package, and packing, conveying, or otherwise handling the package; and a step of mounting the silicon chip on the circuit substrate. The fuse elements F1 and F2 are not disconnected in the semiconductor integrated circuit device. Therefore, even when a discharge path of ESD generated in the semiconductor integrated circuit device is formed by a current path extending to the power wire VDD-A (or the ground wire Vss-A) of the analog circuit part from the input/output terminal T1 of the digital circuit part, or by a current path to the power wire VDD (or the ground wire Vss) of the digital circuit part from the input/output terminal T2 of the analog circuit part in these steps, a usual ESD protecting operation is possible.

During the usual operation, the MOS transistors TDP1, TDN1, TAP1, and TAN1 in the protection circuit are off.

Therefore, the current does not flow between the power wire VDD and ground wire Vss of the digital circuit part and between the power wire VDD-A and ground wire Vss-A of the analog circuit part, and the circuit operation is not affected.

On the other hand, when a positive ESD is supplied to the input/output terminal T1 or T2, the forward current flows to an n well region from a diffused layer of the drain, and an electric charge is discharged to the power wire VDD (or VDD-A) in the MOS transistors TDP1 and TAP1. Moreover, in the MOS transistors TDN1 and TAN1, the backward current flows which exceeds drain withstand pressures of the MOS transistors TDN1 and TAN1, and the electric charge is discharged to the ground wire Vss (or Vss-A). Therefore, the positive ESD does not reach the element in the integrated circuit.

Moreover, when a negative ESD is supplied to the input/output terminal T1 or T2, the forward current flows to a p type substrate from the diffused layer of the drain, and the electric charge is discharged to the ground wire Vss (or Vss-A) in the MOS transistors TDN1 and TAN1. Moreover, in the MOS transistors TDP1 and TAP1, the backward current flows which exceeds the drain withstand pressures of the MOS transistors TDP1 and TAP1, and the electric charge is discharged to the power wire VDD (or VDD-A). Therefore, the negative ESD does not reach the element in the integrated circuit.

That is, in the protection circuit constituted of the MOS transistors TDN1 and TDP1, an overvoltage (e.g., a surge voltage) inputted into the input/output terminal T1 is allowed to escape into any one of the power wire VDD, ground wire Vss, power wire VDD-A, and ground wire Vss-A. Similarly, in the protection circuit constituted of the MOS transistors TAN1 and TAP1, the overvoltage (e.g., the surge voltage) inputted into the input/output terminal T2 is allowed to escape into any one of the power wire VDD, ground wire Vss, power wire VDD-A, and ground wire Vss-A.

Moreover, the semiconductor integrated circuit device is subjected to the following electrostatic discharge test (electrostatic withstand voltage test). In this test, one terminal is grounded among a plurality of reference terminals, and an electric charge of 100 pF is supplied at 2000 V to this terminal. The remaining reference and signal terminals are opened. The reference terminals are connected to the power wires VDD, VDD-A and ground wires Vss, Vss-A, respectively. Since the fuse elements F1 and F2 are not disconnected in the semiconductor integrated circuit device, it is also possible to carry out the electrostatic discharge test.

On the other hand, after the semiconductor integrated circuit device is actually mounted on the circuit substrate, as shown in FIG. 1B, the fuse elements F1 and F2 in the protection circuit are disconnected by a control from the outside of the semiconductor integrated circuit device. When the fuse element F1 is disconnected, the power wire VDD of the digital circuit part is disconnected (electrically isolated) from the power wire VDD-A of the analog circuit part. Similarly, when the fuse element F2 is disconnected, the ground wire Vss of the digital circuit part is disconnected (electrically isolated) from the ground wire Vss-A of the analog circuit part.

As described above, in the semiconductor integrated circuit device before mounted onto the circuit substrate, the power wires VDD and VDD-A are connected to each other via the fuse element F1, and the ground wires Vss and Vss-A are connected to each other via the fuse element F2. Therefore, when the ESD is supplied, breakdown or deterioration of the integrated circuit can be prevented from being caused by a discharge of static electricity energy. Furthermore, it is possible to carry out the electrostatic discharge test which has to be usually carried out with respect to the LSI.

In the mounted substrate device in which the semiconductor integrated circuit device is mounted on the circuit substrate, the power wire VDD and ground wire Vss of the digital circuit part can be disconnected from the power wire VDD-A and ground wire Vss-A of the analog circuit part, respectively, so that the power noise resulting from the operation of the digital circuit part can be prevented from adversely influencing the operation of the analog circuit part. As a result, the operation having a superior characteristic can be realized in the analog circuit.

Additionally, after the semiconductor integrated circuit device (semiconductor chip) is mounted on the circuit substrate as described above, the fuse element F1 between the power wire VDD and the power wire VDD-A, and the fuse element F2 between the ground wire Vss and the ground wire Vss-A are disconnected. This eliminates the discharge path extending to the power wire VDD-A and ground wire Vss-A of the analog circuit part from the input/output terminal T1 of the digital circuit part, and the discharge path to the power wire VDD and ground wire Vss of the digital circuit part from the input/output terminal T2 of the analog circuit part. However, even when these discharge paths are eliminated, the circuit substrate with the semiconductor integrated circuit device mounted thereon has a large capacitance, the signal input terminal of the semiconductor integrated circuit device has a lower chance of being exposed, and another protection circuit is disposed. Therefore, the necessity of input protection is reduced, and there are hardly any problems.

Additionally, in the first embodiment, an example in which the pn junction of the MOS transistor is used as the protection element has been described, but a pn junction of a planar diode may be also used.

Second Embodiment

A mounted substrate device constituted by mounting the semiconductor integrated circuit device on the circuit substrate according to a second embodiment of the present invention will next be described.

Figure 2:
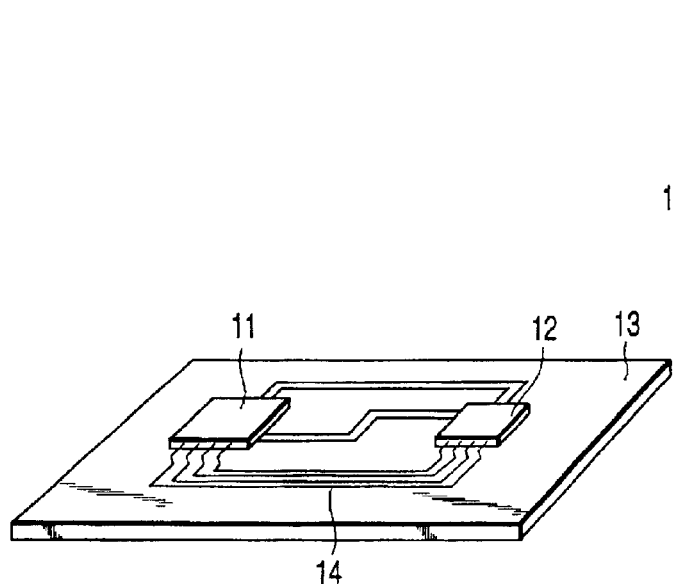
FIG. 2 is a perspective view showing a constitution of a mounted substrate device according to a second embodiment of the present invention.

FIG. 2 is a perspective view showing the constitution of the mounted substrate device of the second embodiment.

For the mounted substrate device, as shown in FIG. 2, a semiconductor integrated circuit device 11 of the first embodiment, and another semiconductor integrated circuit device 12 are mounted on a circuit substrate 13. In the circuit substrate 13, connected wire patterns 14 are formed corresponding to the power wire VDD, power wire VDD-A, ground wire Vss, ground wire Vss-A, and signal input/output terminals T1, T2 of the semiconductor integrated circuit device 11. These wire patterns 14 are disposed on an insulating substrate of the circuit substrate 13.

Figure 3:
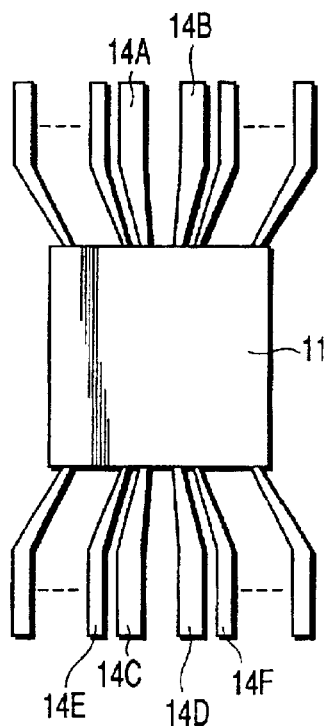
FIG. 3 is an enlarged plan view showing a part on which the semiconductor integrated circuit device is mounted in the mounted substrate device according to the second embodiment.

FIG. 3 is an enlarged plan view of a part on which the semiconductor integrated circuit device 11 is mounted.

As shown in FIG. 3, a wire pattern 14A connected to the power wire VDD in the semiconductor integrated circuit device 11 is disposed around the semiconductor integrated circuit device 11. Similarly, around the semiconductor integrated circuit device 11, there are disposed a wire pattern 14B connected to the power wire VDD-A, a wire pattern 14C connected to the ground wire Vss, a wire pattern 14D connected to the ground wire Vss-A, a wire pattern 14E connected to the signal input/output terminal T1, and a wire pattern 14F connected to the signal input/output terminal T2. Tip ends of these wire patterns 14A to 14F are used as the power terminal, ground terminal, and signal input/output terminal of the mounted substrate device.

For the mounted substrate device 13 constituted as described above, before the fuse elements F1 and F2 of the mounted semiconductor integrated circuit device 11 are disconnected, in the step of packing, conveying, or otherwise handling the device, even when the discharge path of ESD is formed by a current path extending to the wire patterns 14B, 14D (power wire VDD-A, ground wire Vss-A) on an analog circuit side from the wire pattern 14E (input/output terminal T1) on a digital circuit side, or by a current path to the wire patterns 14A, 14C (power wire VDD, ground wire Vss) on the digital circuit side from the wire pattern 14F (input/output terminal T2) on the analog circuit side, the usual ESD protecting operation is possible.

On the other hand, when the fuse elements F1 and F2 are disconnected, and the power wire VDD of the digital circuit part and the power wire VDD-A of the analog circuit part, and the ground wire Vss of the digital circuit part and the ground wire Vss-A of the analog circuit part are disconnected (electrically isolated) by the control from the outside of the semiconductor integrated circuit device 11, the power noise resulting from the operation of the digital circuit part can be prevented from adversely influencing the operation of the analog circuit part. As a result, an operation having superior characteristics can be realized in the analog circuit.

Additionally, in the mounted substrate device with the semiconductor integrated circuit device 11 mounted thereon as described above, when the fuse element F1 between the power wires VDD and VDD-A, and the fuse element F2 between the ground wires Vss and Vss-A are disconnected, the discharge path extending to the wire patterns 14B, 14D (power wire VDD-A, ground wire Vss-A) on the analog circuit side from the wire pattern 14E (input/output terminal T1) on the digital circuit side, and the discharge path extending to the wire patterns 14A, 14C (power wire VDD, ground wire Vss) on the digital circuit side from the wire pattern 14F (input/output terminal T2) on the analog circuit side are eliminated. However, even when these discharge paths are eliminated, the circuit substrate 13 with the semiconductor integrated circuit device 11 mounted thereon has a large capacitance, the power terminal, ground terminal, and signal input/output terminal of the mounted substrate device have a less opportunity of being exposed, and another protection circuit is disposed. Therefore, the necessity of input protection is reduced, and there are hardly any problems.

Third Embodiment

A method of disconnecting the power wire or the ground wire between the digital and analog circuit parts will next be described in the mounted substrate device with the semiconductor integrated circuit device mounted thereon according to a third embodiment of the present invention.

Figure 4:
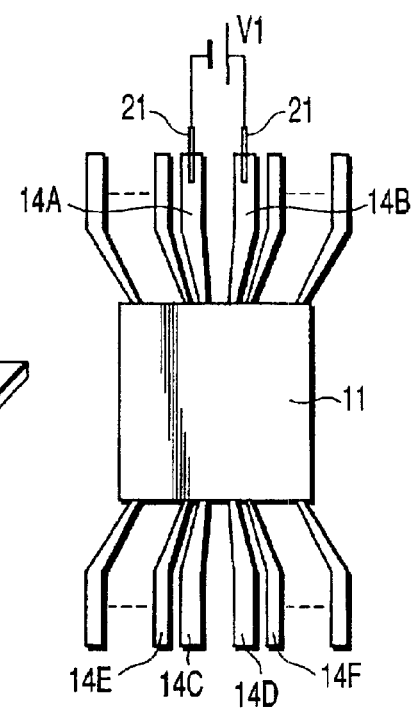
FIG. 4 is a plan view showing a disconnecting method of a power wire in the mounted substrate device according to a third embodiment of the present invention.
Figure 5:
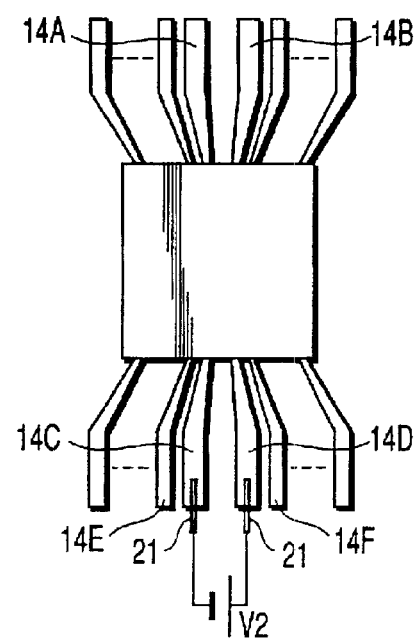
FIG. 5 is a plan view showing a disconnecting method of a ground wire in the mounted substrate device according to the third embodiment.

FIG. 4 is a diagram showing the disconnecting method of the power wire in the mounted substrate device according to the third embodiment, and FIG. 5 is a diagram showing the disconnecting method of the ground wire in the mounted substrate device.

First, as shown in FIG. 4, probe styluses 21 of a test apparatus are brought into contact with the wire patterns 14A and 14B on the circuit substrate. The wire pattern 14A is connected to the power wire VDD of the digital circuit part in the semiconductor integrated circuit device 11, and the wire pattern 14B is connected to the power wire VDD-A of the analog circuit part.

Thereafter, a positive or negative current is passed through the wire pattern 14A, and a direct-current voltage V1 is supplied between the patterns. Thereby, the first fuse element F1 is disconnected, and the power wires VDD and VDD-A are electrically isolated.

Subsequently, as shown in FIG. 5, the probe styluses 21 of the test apparatus are brought into contact with the wire patterns 14C and 14D on the circuit substrate. The wire pattern 14C is connected to the ground wire Vss of the digital circuit part in the semiconductor integrated circuit device 11, and the wire pattern 14D is connected to the ground wire Vss-A of the analog circuit part in the semiconductor integrated circuit device 11.

Thereafter, the positive or negative current is passed through the wire pattern 14C, and a direct-current voltage V2 is supplied between the patterns. Thereby, the second fuse element F2 is disconnected, and the ground wires Vss and Vss-A are electrically isolated.

As described above, in the third embodiment, after the semiconductor integrated circuit device is mounted on the circuit substrate, the voltages are supplied to opposite ends of the first fuse element F1, and thereby the power wire VDD can be disconnected from the power wire VDD-A. Similarly, when the voltages are supplied to the opposite ends of the second fuse element F2, the power wire Vss can be disconnected from the power wire Vss-A.

Examples of the method of disconnecting the power line or the ground line in the semiconductor integrated circuit device after mounting the semiconductor integrated circuit device on the circuit substrate have heretofore included only a method using a laser and method using a focused ion beam (FIB). In the third embodiment, when a place to be disconnected, and the like are known through evaluation of an operating margin in defect analysis before layout design, the fuse element is inserted in the place to be disconnected beforehand, and thereby a sample chip for the defect analysis can quickly be prepared. Thereby, it is possible to reduce the turnaround time for the evaluation and analysis of the semiconductor integrated circuit device.

Additionally, the present invention can be applied as the ESD protection circuit, when the noise of the power wire in the digital circuit is known not to influence the analog circuit, and even when the input protection with respect to the positive ESD is considered to be important and only the second fuse element is disposed. Similarly, when the noise of the ground wire in the digital circuit is known not to influence the analog circuit, and even when the input protection with respect to the negative ESD is considered to be important and only the first fuse element is disposed, the present invention can be applied.

Moreover, to disconnect the fuse elements F1, F2, the voltage is supplied from the outside of the semiconductor integrated circuit device without using irradiation with a laser beam. Therefore, in the semiconductor integrated circuit device using a multilayered wire structure, the fuse element may be formed in an optional metal wire layer in a multilayered wire or by a poly crystal silicon wire.

Furthermore, in the above-described embodiments, the fuse elements F1, F2 are disposed between the power wires VDD and VDD-A, and between the ground wires Vss and Vss-A in the semiconductor integrated circuit device, respectively. When these fuse elements are disconnected, the power and ground wires are disconnected. However, this constitution is not limited to the fuse element, and elements other than the fuse element may be used.

Additionally, the above-described embodiments can be carried out not only alone but also in an appropriate combination. Furthermore, the above-described embodiments include various stages of the invention. When a plurality of constituting requirements disclosed in the respective embodiments are appropriately combined, it is also possible to extract various stages of the invention.

As described above, according to the embodiments of the present invention, there can be provided the semiconductor integrated circuit device, mounted substrate device, and disconnecting method of the power line in which element breakdown resulting from the electrostatic discharge can be prevented in packing, conveying, or otherwise handling the package of the integrated circuit chips, the digital power line can be disconnected from the analog power line during usual use, and the power noise resulting from the digital circuit operation can be prevented from being propagated to the analog circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor integrated circuit device comprising:
    a first power wire which supplies a power potential to a circuit having a first function;
    a first ground wire which supplies a ground potential to the circuit having said first function;
    a first protection circuit which is connected between said first power wire and said first ground wire, and protects the circuit having said first function;
    a second power wire which supplies a power potential to a circuit having a second function;
    a second ground wire which supplies a ground potential to the circuit having said second function;
    a second protection circuit which is connected between said second power wire and said second ground wire, and protects the circuit having said second function; and
    a fuse element which is disposed in at least one of intervals between said first power wire and said second power wire and between said first ground wire and said second ground wire, and brings one of said intervals into a disconnected state.

2. The semiconductor integrated circuit device according to claim 1, wherein the circuit having said first function includes a digital circuit, and the circuit having said second function includes an analog circuit.

3. The semiconductor integrated circuit device according to claim 1, wherein said first and second protection circuits are connected to input/output terminals, and said first and second protection circuits allow surge voltages inputted into said input/output terminals to escape into any one of said first power wire, first ground wire, second power wire, and second ground wire.

4. The semiconductor integrated circuit device according to claim 1, wherein said fuse element comprises a metal wire.

5. The semiconductor integrated circuit device according to claim 1 wherein said fuse element comprises a poly crystal silicon wire.

6. A semiconductor integrated circuit device comprising:
    a first power wire which supplies a power potential to a circuit having a first function;
    a first ground wire which supplies a ground potential to the circuit having said first function;
    a first protection circuit which is connected between said first power wire and said first ground wire, and protects the circuit having said first function;
    a second power wire which supplies a power potential to a circuit having a second function;
    a second ground wire which supplies a ground potential to the circuit having said second function;
    a second protection circuit which is connected between said second power wire and said second ground wire, and protects the circuit having said second function; and
    a fuse element which is disposed in at least one of intervals between said first power wire and said second power wire and between said first ground wire and said second ground wire, and brings one of said intervals into either one state of a connected state and a disconnected state.

7. The semiconductor integrated circuit device according to claim 6, wherein the circuit having said first function includes a digital circuit, and the circuit having said second function includes an analog circuit.

8. The semiconductor integrated circuit device according to claim 6, wherein said first and second protection circuits are connected to input/output terminals, and said first and second protection circuits allow surge voltages inputted into said input/output terminals to escape into any one of said first power wire, first ground wire, second power wire, and second ground wire.

9. The semiconductor integrated circuit device according to claim 6, wherein said fuse element comprises a metal wire.

10. The semiconductor integrated circuit device according to claim 6, wherein said fuse element comprises a poly crystal silicon wire.

11. The semiconductor integrated circuit device according to claim 6, wherein said fuse element is disconnected, after said semiconductor integrated circuit device is mounted on a circuit substrate.

12. A mounted substrate device comprising:
    a semiconductor integrated circuit device including:
        a first power wire which supplies a power potential to a circuit having a first function;
        a first ground wire which supplies a ground potential to the circuit having said first function;
        a first protection circuit which is connected between said first power wire and said first ground wire, and protects the circuit having said first function;
    a second power wire which supplies a power potential to a circuit having a second function;
        a second ground wire which supplies a ground potential to the circuit having said second function;
        a second protection circuit which is connected between said second power wire and said second ground wire, and protects the circuit having said second function; and
        a fuse element which is disposed in at least one of intervals between said first power wire and said second power wire and between said first ground wire and said second ground wire, and brings one of said intervals into a disconnected state; and
    a circuit substrate on which said semiconductor integrated circuit device is mounted, and which has a plurality of wire patterns connected to said first power wire, second power wire, first ground wire, and second ground wire.

13. The mounted substrate device according to claim 12, wherein the circuit having said first function includes a digital circuit, and the circuit having said second function includes an analog circuit.

14. The mounted substrate device according to claim 12, wherein said first and second protection circuits are connected to input/output terminals, and said first and second protection circuits allow surge voltages inputted into said input/output terminals to escape into any one of said first power wire, first ground wire, second power wire, and second ground wire.

15. The mounted substrate device according to claim 12, wherein said fuse element comprises a metal wire.

16. The mounted substrate device according to claim 12, wherein said fuse element comprises a poly crystal silicon wire.

17. The mounted substrate device according to claim 12, wherein said fuse element is disconnected, after said semiconductor integrated circuit device is mounted on the circuit substrate.

18. A wire disconnecting method of a mounted substrate device, comprising:
    forming a semiconductor integrated circuit device having a fuse element, said fuse element being disposed in at least one of intervals between a first power wire and a second power wire and between a first ground wire and a second ground wire, and bringing one of said intervals into either one state of a connected state and a disconnected state;
    mounting said semiconductor integrated circuit device on a circuit substrate; and
    disconnecting said fuse element in said semiconductor integrated circuit device.

19. The wire disconnecting method of the mounted substrate device according to claim 18, wherein said disconnecting said fuse element is performed by supplying a voltage to said fuse element.

20. The wire disconnecting method of the mounted substrate device according to claim 18, wherein said fuse element is disconnected, after said semiconductor integrated circuit device is mounted on the circuit substrate.

21. The wire disconnecting method of the mounted substrate device according to claim 18, wherein said fuse element is disconnected, after said semiconductor integrated circuit device is subjected to a electrostatic withstand voltage test.

22. The wire disconnecting method of the mounted substrate device according to claim 18, wherein said semiconductor integrated circuit device includes a device formed by sealing a semiconductor chip in a package.

23. The wire disconnecting method of the mounted substrate device according to claim 18, wherein said first power wire supplies a power potential to a circuit having a first function, said first ground wire supplies a ground potential to the circuit having said first function, said second power wire supplies a power potential to a circuit having a second function, and said second ground wire supplies a ground potential to the circuit having said second function.

24. The wire disconnecting method of the mounted substrate device according to claim 18, wherein a first protection circuit is connected between said first power wire and said first ground wire, and protects the circuit having said first function, and a second protection circuit is connected between said second power wire and said second ground wire, and protects the circuit having said second function.

25. The wire disconnecting method of the mounted substrate device according to claim 23, wherein the circuit having said first function includes a digital circuit, and the circuit having said second function includes an analog circuit.

26. The wire disconnecting method of the mounted substrate device according to claim 24, wherein said first and second protection circuits are connected to input/output terminals, and said first and second protection circuits allow surge voltages inputted into said input/output terminals to escape into any one of said first power wire, first ground wire, second power wire, and second ground wire.

27. The wire disconnecting method of the mounted substrate device according to claim 18, wherein said fuse element comprises a metal wire.

28. The wire disconnecting method of the mounted substrate device according to claim 18, wherein said fuse element comprises a poly crystal silicon wire.

* * * * *